United States Patent [19]

Staudinger et al.

[11] Patent Number: 5,506,544
[45] Date of Patent: Apr. 9, 1996

[54] BIAS CIRCUIT FOR DEPLETION MODE FIELD EFFECT TRANSISTORS

[75] Inventors: Joseph Staudinger; Joel D. Birkeland, both of Gilbert; Vijay K. Nair, Mesa, all of Ariz.

[73] Assignee: Motorola, Inc., Schaumburg, Ill.

[21] Appl. No.: 419,500

[22] Filed: Apr. 10, 1995

[51] Int. Cl.$^6$ ........................................ H03F 3/16
[52] U.S. Cl. .......................... 330/277; 330/289; 330/296
[58] Field of Search ................................... 327/537, 543; 330/277, 289, 296

[56] References Cited

U.S. PATENT DOCUMENTS 5,068,623  11/1991  Camin et al. .................. 330/296 X
5,361,007  11/1994  Ohta ............................. 327/543 X Primary Examiner—Steven J. Mottola
Attorney, Agent, or Firm—Robert D. Atkins

[57] ABSTRACT

An amplifier (10) receives a bias voltage to the gate of a depletion mode field effect transistor (12). In one embodiment, a bias circuit (20) offsets (22) the bias voltage from a power supply potential (26) to maintain substantially constant drain current over a range of threshold voltages (34, 36,38) caused by process and temperature variation. In an alternate embodiment, a transistor (58) in the bias circuit (50) provides an incremental current flow to compensate the bias voltage of the MESFET for variation in threshold voltages. The bias circuit is applicable to other depletion mode field effect transistor circuits having a negative threshold voltage.

19 Claims, 2 Drawing Sheets

BIAS CIRCUIT FOR DEPLETION MODE FIELD EFFECT TRANSISTORS

BACKGROUND OF THE INVENTION

The present invention relates in general to depletion mode transistor circuits and, more particularly, to a bias circuit for minimizing quiescent current variation in a depletion mode field effect transistor.

Radio frequency (RF) amplifiers are commonly used in applications such as cellular telephones to amplify high frequency signals in the 800–900 MHz range. The amplified RF signal is transmitted over airways to a receiving unit. A typical RF amplifier includes a metal semiconductor field effect transistor (MESFET) that receives the RF input signal at its gate. The drain of the MESFET is coupled through an RF choke to a positive power supply conductor for providing the amplifier RF output signal.

The gate of the MESFET must be biased for proper operation. The bias point along with the load line and input RF voltage waveform determine the drain current through the power transistor. In order to achieve maximum efficiency, there is a trade-off between maximum transmitted RF power and minimum power consumption. Minimizing power consumption is especially important in battery supplied applications. It is also important to control the bias point over temperature and process variation to maintain constant drain current through the MESFET.

In the prior art, a resistor divider network has been used to bias the power MESFET. The resistors are typically laser trimmed to adjust the bias on each amplifier to compensate for process variation. The resistor trimming is an expensive step in manufacturing and generally fails to compensate for temperature variation in later operation. Another known bias circuit includes complex digital and analog circuitry that samples the drain current of the power transistor and makes dynamic adjustments to the bias voltage. The sampling circuit tends to be over complex and expensive to manufacture.

Hence, a need exists for a simple bias circuit for MESFET circuits to maintain constant drain current.

BRIEF DESCRIPTION OF THE DRAWINGS

FIG. 4 is a schematic diagram illustrating an alternate bias circuit for the MESFET amplifier.

DETAILED DESCRIPTION OF THE PREFERRED EMBODIMENT

Figure 1:
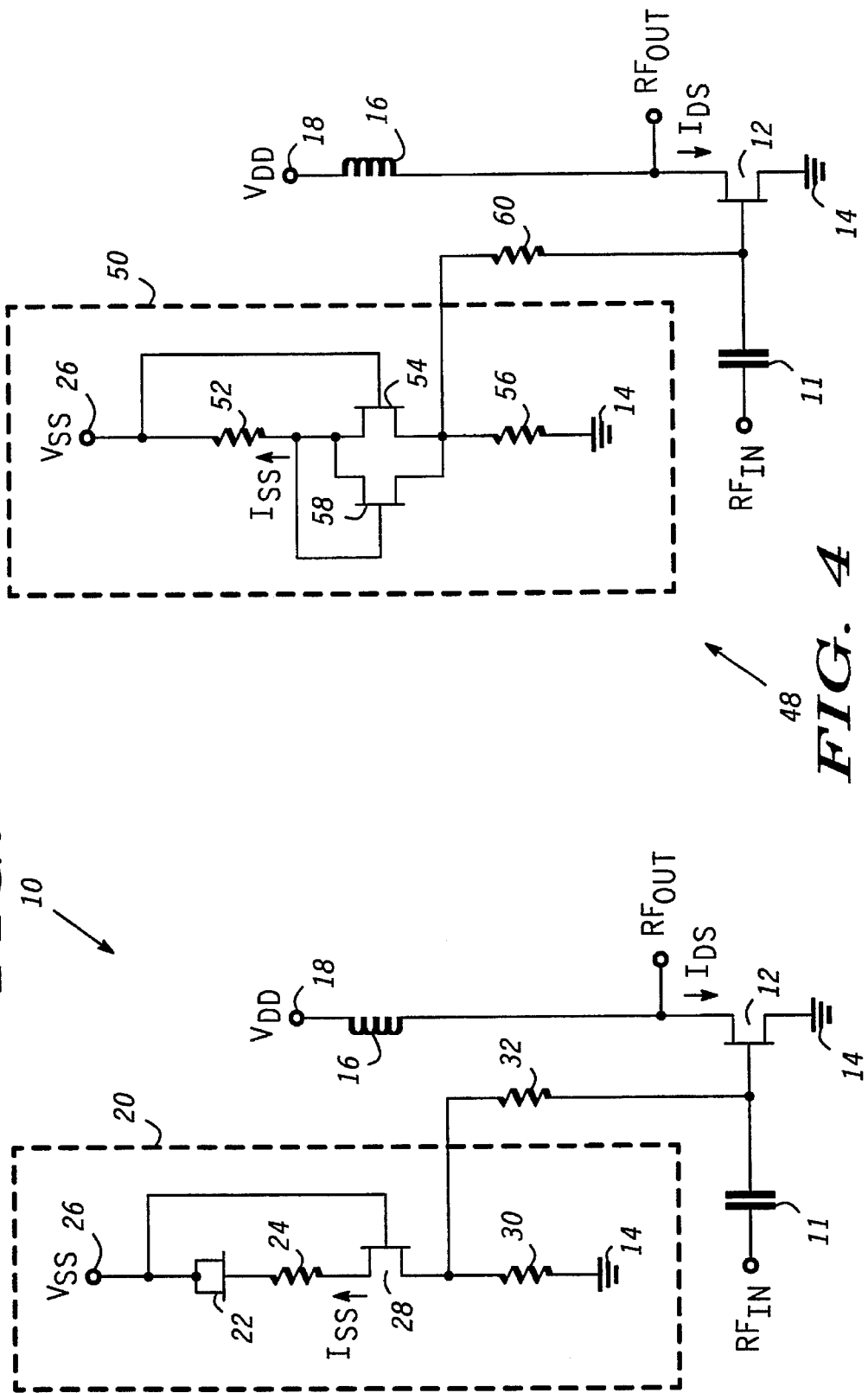
FIG. 1 is a schematic diagram illustrating a bias circuit for a MESFET amplifier.

Referring to FIG. 1, an RF amplifier 10 is shown suitable for manufacturing as an integrated circuit (IC) using conventional monolithic IC processes. An $RF_{IN}$ signal operating at say 900 MHz is AC-coupled through capacitor 11 to the gate of transistor 12. Transistor 12 is a gallium arsenide depletion mode MESFET operating as a power device that conducts 200.0 milliamps quiescent current nominally. The source of transistor 12 is coupled to power supply conductor 14 operating at ground potential. The drain of transistor 12 is coupled through RF choke 16 to power supply conductor 18 operating at $V_{DD}$=5.0 volts. The RF choke is selected at 15.0 nanohenries. The $RF_{OUT}$ signal is taken at the drain of transistor 12.

A bias circuit 20 is coupled to the gate of transistor 12 and sets its bias operating point. Bias circuit 20 includes transistor 22 and resistor 24 serially coupled between power supply conductor 26 and the source of transistor 28. Transistor 22 and resistor 24 may be reverse in order with respect to the arrangement shown in FIG. 1. Power supply conductor 26 operates at $V_{SS}$=−4.0 volts. Transistor 22 is configured as a diode with its drain and source (anode) coupled together to power supply conductor 26 and its gate (cathode) coupled to one end of resistor 24 for providing a voltage offset. The gate of transistor 28 receives power supply $V_{SS}$, while its drain is coupled through resistor 30 to power supply conductor 14. Resistor 24 is selected at 2120.0 ohms, and resistor 30 is selected at 3120.0 ohm. Transistors 22 and 28 are also MESFET devices. Resistor 32 is selected at 1000.0 ohm and coupled between the source of transistor 28 and the gate of transistor 12 to isolate the RF signal from bias circuit 20.

The operation of amplifier 10 proceeds as follows. Bias circuit 20 generates a bias voltage at the gate of transistor 12 that maintains a constant drain current $I_{DS}$ over temperature and process variation. Bias circuit 20 is applicable to any depletion mode field effect transistor circuit with a negative threshold voltage ($V_{TH}$<0), including MESFETs, HEMTs, HFETs, MODFETs, JFETs, etc. Other examples of depletion mode circuits within the scope of the present invention include mixers, oscillators, and multipliers.

The gate of transistor 28 receives the negative supply voltage $V_{SS}$ causing it to operate in saturation (drain-source voltage>1.0 volts) and conduct current $I_{SS}$ through resistors 24 and 30. In one embodiment, the gate width of transistor 28 is scaled to 1/50 the gate width of transistor 12. Transistor 22 operates as a diode to generate a 0.7 voltage offset between $V_{SS}$ and the source of transistor 28. The current $I_{SS}$ develops a bias voltage across resistor 30 ($I_{SS}\cdot R30$) which is applied through resistor 32 to the gate of transistor 12. The current $I_{SS}$ is proportional to temperature and process variation. The current through resistor 32 is very small so the voltage drop across resistor 32 is negligible. The bias voltage establishes the quiescent operating point for transistor 12.

Figure 2:
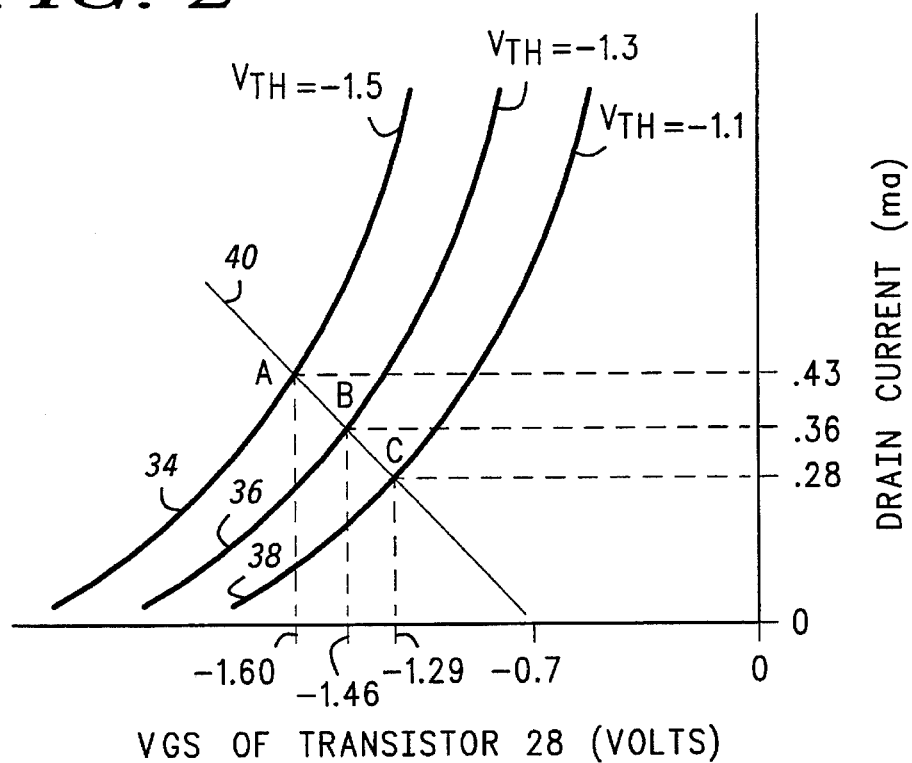
FIGS. 2 and 3 are plots of drain current versus gate-source voltage.

Turning to FIG. 2, the gate-source voltage ($V_{GS}$) versus drain current of transistor 28 is shown with a characteristic curve 34 plotted with a threshold voltage ($V_{TH}$) equal to −1.5 volts. The threshold is defined at the point where the drain current $I_{DS}$ equals zero. Any value greater than $V_{TH}$ causes some current to flow through the transistor. A second characteristic curve 36 is plotted at $V_{TH}$=−1.3 volts, and a third characteristic curve 38 is plotted at $V_{TH}$=−1.1 volts. A load line 40 as determined by the inverse of resistor 24 intersects characteristic curves 34–38 at points A, B, and C, respectively. Notice that load line 40 is shifted from the origin by the offset voltage (0.7 volts) of transistor 22.

Figure 3:
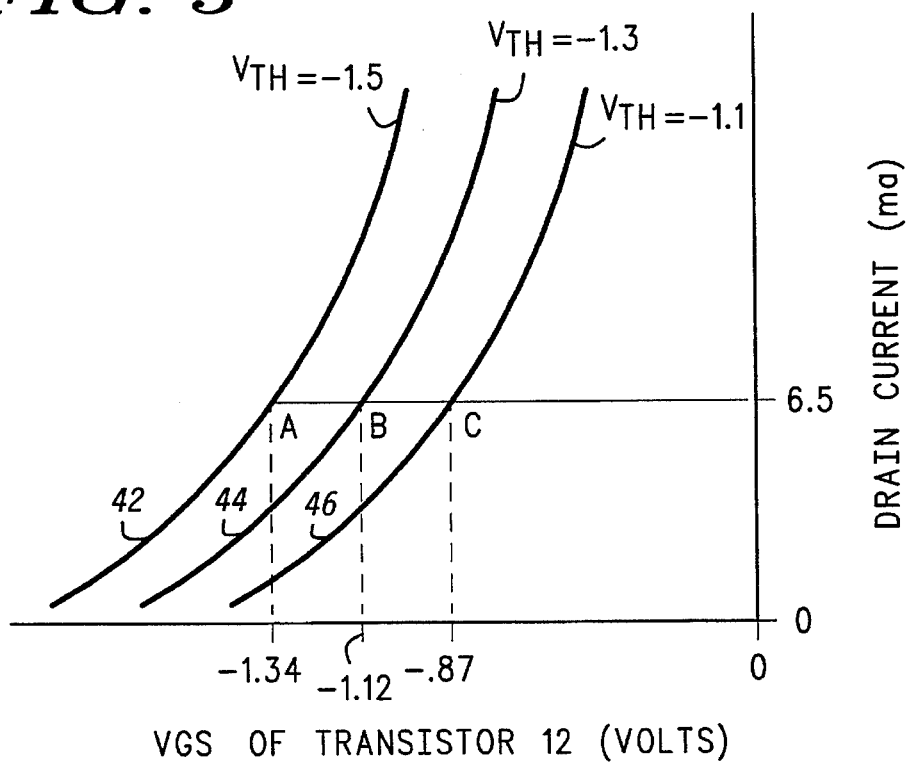

In FIG. 3, the $V_{GS}$ versus drain current of transistor 12 is shown with a characteristic curve 42 plotted at $V_{TH}$=−1.5 volts. A second characteristic curve 44 is plotted at $V_{TH}$=−1.3 volts, and a third characteristic curve 46 is plotted at $V_{TH}$=−1.1 volts.

Assume transistors 12 and 28 operate with same percentage of $I_{DSS}$ as shown in equation (1).

$$\frac{I_{SS}}{I_{DSS28}} = \frac{I_{DS}}{I_{DSS12}} \qquad (1)$$

where:

$I_{DSS28}$ is the saturation current of transistor 28 with $V_{GS}$=0.

$I_{DSS12}$ is the saturation current of transistor 12 with $V_{GS}=0$.

As the threshold voltage of transistor 28 changes from −1.5 to −1.1 volts, the current $I_{SS}$ changes from 0.43 to 0.28 milliamps (ma) along load line 40 as shown in FIG. 2. The bias voltage applied to the gate of transistor 12 changes as $V_{BIAS}=I_{SS}\cdot R_{30}$, again neglecting any drop across resistor 32. For $V_{TH}=-1.5$ (maximum), the bias voltage is 0.43 ma . 3120 ohms=−1.34 volts. For $V_{TH}=-1.3$ (nominal), the bias voltage is 0.36 ma . 3120 ohms=−1.12 volts. For $V_{TH}=-1.1$ (minimum), the bias voltage is 0.28 ma . 3120 ohms=−0.87 volts. In FIG. 3, the same bias voltages $V_{BIAS}$ determined by $I_{SS}\cdot R_{30}$ are read from the bottom of the graph to characteristic curves 42, 44 and 46. The characteristic curves 42–46 represent typical temperature effects and process variation such that the bias voltages all correspond to substantially the same drain current $I_{DS}$.

A feature of the present invention is to offset the $V_{GS}$ of transistor 28 with the voltage across diode configured transistor 22. The voltage offset shifts load line 40 away from the origin as shown in FIG. 2 and provides the proper dependence of $I_{SS}$ with temperature and process variation without drawing excessive drain current through transistor 28. Thus, with transistors 12 and 28 disposed on the same IC die and having similar characteristics, the current $I_{SS}$ develops the bias voltage that maintains a constant quiescent current $I_{DS}$ through transistor 12.

An alternate embodiment of the present invention is shown in FIG. 4 as amplifier 48. Components having a similar function assigned the same reference numbers used in FIG. 1. A bias circuit 50 is coupled to the gate of transistor 12 and sets its bias operating point. Bias circuit 50 includes resistor 52 coupled between power supply conductor 26 and the source of transistor 54. The gate of transistor 54 receives the negative power supply $V_{SS}$, while its drain is coupled through resistor 56 to power supply conductor 14. Transistor 58 includes a gate and source coupled together the source of transistor 54. The drain of transistor 58 coupled to the drain of transistor 54. Resistors 52 and 56 are each selected at 400.0 ohms. Transistors 54 and 58 are also MESFET devices. Resistor 60 is selected at 3 K ohm and coupled between the drain of transistor 54 and the gate of transistor 12 to isolate the RF signal from bias circuit 50.

The operation of amplifier 48 proceeds as follows. Bias circuit 50 generates a bias voltage at the gate of transistor 12 that maintains a constant drain current $I_{DS}$ over temperature and process variation. The gate of transistor 54 receives the negative supply voltage $V_{SS}$ causing it to operate in saturation and conduct current $I_{SS}$ through resistors 52 and 56. In practice, the gate width of transistor 54 is scaled to 1/50 the gate width of transistor 12. Resistor 52 sets the bias point of transistor 54 because the voltage drop across resistor 52 ($I_{SS}\cdot R_{52}$) is equal to the $V_{GS}$ of transistor 54. Since resistors 52 and 56 conduct the same current, the voltage drop across resistor 56 is proportional to $V_{GS}$ of transistor 54. Neglecting the voltage drop across resistor 60, the $V_{GS}$ of transistor 54 is substantially equal to $V_{GS}$ of transistor 12.

Transistor 58 operates in saturation (drain-source voltage>0.7 volts) with $I_{DSS58}$ varying with its threshold voltage. Transistor 58 provides an incremental current flow through resistor 52 to compensate the bias voltage of transistor 12 for variation in threshold voltages. As the threshold voltages of transistor 54 and 58 becomes more negative, the saturation current through transistor 58 increases and causes more voltage drop across resistor 52. The same delta voltage drop occurs across resistor 56 since each conducts the same current. The bias voltage to transistor 12 thus reduces to compensate for the more negative threshold voltage of transistor 54. Likewise, as the threshold voltage of transistor 54 becomes more positive, the saturation current through transistor 58 decreases and causes less voltage drop across resistor 52. The same delta voltage drop occurs across resistor 56 since each conducts the same current. The bias voltage to transistor 12 thus increases to compensate for the more positive threshold voltage of transistor 54.

By now it should be appreciated that the present invention generates a bias voltage to the gate of a MESFET transistor. The bias circuit is applicable to other depletion mode field effect transistor circuits having a negative threshold voltage. In one embodiment, the bias voltage is offset from a power supply potential to maintain substantially constant drain current over a variety of threshold voltages, processes, and temperatures. In an alternate embodiment, a transistor in the bias circuit provides an incremental current flow to compensate the bias voltage of the depletion mode FET for variation in threshold voltages.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A depletion mode circuit, comprising:

a power transistor having a gate coupled for receiving an input signal, a drain coupled for providing an output signal, and a source coupled to a first power supply conductor; and a bias circuit having a voltage that is offset from a second power supply conductor to generate a bias voltage for said gate of said power transistor to maintain constant drain current, said bias circuit including, (a) a first transistor having a gate coupled to said second power supply conductor, and a drain coupled to said gate of said power transistor, (b) a voltage offset circuit and first resistor serially coupled between said second power supply conductor and a source of said first transistor, and (c) a second resistor coupled between said drain of said first transistor and said first power supply conductor.

2. The depletion mode circuit of claim 1 wherein said voltage offset circuit includes a diode having an anode coupled to said second power supply conductor and having a cathode coupled to said source of said first transistor.

3. The depletion mode circuit of claim 1 wherein said voltage offset circuit includes a second transistor having a drain and source coupled together to said second power supply conductor and having a gate coupled to said source of said first transistor.

4. The depletion mode circuit of claim 1 further including a third resistor coupled between said drain of said first transistor and said gate of said power transistor.

5. The depletion mode circuit of claim 4 further including a choke coupled between a third power supply conductor and said drain of said power transistor.

6. The depletion mode circuit of claim 5 wherein said power transistor is a metal semiconductor field effect transistor.

7. The depletion mode circuit of claim 6 wherein said first transistor has a gate width less than a gate width of said power transistor.

8. An amplifier, comprising:

a power transistor having a gate coupled for receiving an input signal, a drain coupled for providing an output signal, and a source coupled to a first power supply conductor;

a first transistor having a gate coupled to a second power supply conductor, and a drain coupled to said gate of said transistor;

a voltage offset circuit and first resistor serially coupled between said second power supply conductor and a source of said first transistor; and a second resistor coupled between said drain of said first transistor and said first power supply conductor.

9. The amplifier of claim 8 wherein said voltage offset circuit includes a diode having an anode coupled to said second power supply conductor and having a cathode coupled to said source of said first transistor.

10. The amplifier of claim 9 wherein said voltage offset circuit includes a second transistor having a drain and source coupled together to said second power supply conductor and having a gate coupled to said source of said first transistor.

11. The amplifier of claim 10 further including a third resistor coupled between said drain of said first transistor and said gate of said power transistor.

12. The amplifier of claim 11 further including a choke coupled between a third power supply conductor and said drain of said power transistor.

13. The amplifier of claim 12 wherein said power transistor is a metal semiconductor field effect transistor.

14. The amplifier of claim 13 wherein said first transistor has a gate width less than a gate width of said power transistor.

15. A depletion mode circuit, comprising:

a power transistor having a gate coupled for receiving an input signal, a drain coupled for providing an output signal, and a source coupled to a first power supply conductor;

a first transistor having a gate coupled to a second power supply conductor, and a drain coupled to said gate of said power transistor;

a second transistor having a gate and source coupled together to said source of said first transistor, and a drain coupled to said drain of said first transistor;

a first resistor coupled between said second power supply conductor and said source of said first transistor; and a second resistor coupled between said drain of said first transistor and said first power supply conductor.

16. The depletion mode circuit of claim 15 further including a third resistor coupled between said drain of said first transistor and said gate of said power transistor.

17. The depletion mode circuit of claim 16 further including a choke coupled between a third power supply conductor and said drain of said power transistor.

18. The depletion mode circuit of claim 17 wherein said power transistor is a metal semiconductor field effect transistor.

19. The depletion mode circuit of claim 18 wherein said first transistor has a gate width less than a gate width of said power transistor.

* * * * *